United States Patent
Hee et al.

(10) Patent No.: US 11,049,968 B2
(45) Date of Patent: Jun. 29, 2021

(54) SEMICONDUCTOR DEVICE AND METHOD OF MANUFACTURING A SEMICONDUCTOR DEVICE

(71) Applicant: X-FAB SEMICONDUCTOR FOUNDRIES AG, Erfurt (DE)

(72) Inventors: Eng Gek Hee, Sarawak (MY); Ek Chien Yeo, Sarawak (MY); Steffen Thiem, Moritzburg (DE); Choon Swee Tan, Sarawak (MY)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 15/914,202

(22) Filed: Mar. 7, 2018

(65) Prior Publication Data
US 2019/0280121 A1 Sep. 12, 2019

(51) Int. Cl.
| | |
|---|---|
| H01L 29/78 | (2006.01) |
| H01L 29/792 | (2006.01) |
| H01L 29/66 | (2006.01) |
| H01L 29/786 | (2006.01) |
| H01L 29/788 | (2006.01) |
| H01L 29/06 | (2006.01) |
| H01L 21/84 | (2006.01) |
| H01L 27/12 | (2006.01) |

(52) U.S. Cl.
CPC ........ *H01L 29/7843* (2013.01); *H01L 21/84* (2013.01); *H01L 27/1203* (2013.01); *H01L 29/0649* (2013.01); *H01L 29/66833* (2013.01); *H01L 29/788* (2013.01); *H01L 29/7849* (2013.01); *H01L 29/78654* (2013.01); *H01L 29/792* (2013.01)

(58) Field of Classification Search
CPC ............. H01L 29/7843; H01L 29/0649; H01L 29/66833; H01L 29/7849; H01L 29/78654; H01L 29/788; H01L 29/792
See application file for complete search history.

(56) References Cited

U.S. PATENT DOCUMENTS

| | | | | |
|---|---|---|---|---|
| 7,829,927 | B2* | 11/2010 | Bidan | G11C 13/02 257/298 |
| 8,008,713 | B2* | 8/2011 | Dobuzinsky | H01L 29/792 257/330 |
| 2004/0043638 | A1* | 3/2004 | Nansei | H01L 21/0234 438/792 |
| 2006/0102955 | A1* | 5/2006 | Chen | H01L 29/66575 257/349 |
| 2006/0131672 | A1* | 6/2006 | Wang | H01L 29/7843 257/410 |
| 2007/0077741 | A1* | 4/2007 | Frohberg | H01L 21/823807 438/586 |
| 2007/0077773 | A1 | 4/2007 | Frohberg et al. | |
| 2007/0254444 | A1* | 11/2007 | Bloomquist | H01L 29/7843 438/305 |

(Continued)

*Primary Examiner* — Zandra V Smith
*Assistant Examiner* — Andre C Stevenson
(74) *Attorney, Agent, or Firm* — Nixon & Vanderhye PC

(57) ABSTRACT

A semiconductor memory device comprising a strained semiconductor layer and a contact etch stop layer, CESL, wherein the strained semiconductor layer and the CESL are both arranged to reduce the probability of an electron tunnelling out of a charge trapping layer of the semiconductor memory device.

18 Claims, 4 Drawing Sheets

(56) References Cited

U.S. PATENT DOCUMENTS

| | | | |
|---|---|---|---|
| 2008/0020594 A1* | 1/2008 | Kim | H01L 45/06 438/787 |
| 2010/0301416 A1* | 12/2010 | Hoentschel | H01L 29/7833 257/351 |
| 2016/0079251 A1 | 3/2016 | Li et al. | |

* cited by examiner

SEMICONDUCTOR DEVICE AND METHOD OF MANUFACTURING A SEMICONDUCTOR DEVICE

This invention relates to the field of semiconductor devices.

In one aspect, the present invention provides a semiconductor memory device comprising at least one strained semiconductor layer in addition to a contact etch stop layer to change/reduce the probability of an electron tunnelling out of a charge trapping layer of the semiconductor memory device.

Strained silicon on insulator (SSOI) structures may be used to improve data retention in memory modules as well as to improve mobility gain in metal-oxide-semiconductor field-effect transistors (MOSFETs). The performance of a non-volatile memory (NVM), such as a flash memory, depends on the device's ability to control the trapping and releasing of electrons. One type of memory is a floating gate non-volatile memory where charge is trapped within a polysilicon material of the memory gate, whereas another non-volatile memory device is a SONOS memory where charge is trapped within an ONO stack. The gate is electrically isolated from the surrounding structures and the isolation forms a barrier to the electrons. In a reliable flash memory, the electrons may be trapped within the memory gate for years. The performance of a memory is limited by a small probability that the electrons escape through the barriers by tunneling. The underlying physical mechanism which contributes to a better performance of a strained semiconductor substrate is a reduction of the probability that an electron tunnels through barriers provided within a semiconductor structure.

The tunneling probability may be expressed by the following equation (equation 1).

$$T \approx \exp\left(-\frac{4\sqrt{2m^*}\, E_g^{3/2}}{3e\hbar\mathcal{E}}\right) \quad \text{(Eq. 1)}$$

In equation 1, T is the tunneling probability, $E_g$ is the bandgap of the semiconductor, m* is the reduced mass of the electron-hole system, also called electron conductivity mass or effective mass, $\varepsilon$ is the electric field, e is the charge of the electrons and n is the Planck constant. The tunneling probability may be reduced by manipulating the different factors in this equation.

The inventor has appreciated that strained substrates can be used in a memory device to improve the reliability of the memory.

The inventor has also appreciated that a contact etch stop layer (CESL) or dual contact etch stop layer (DCESL), also known as a dual stress liner (DSL), can be used in a semiconductor memory device to further improve data retention and endurance characteristics of the memory. The CESL/DCESL may be used in addition to, or instead of, a strained substrate.

The inventor has also appreciated that fabrication of certain oxide layers of the memory device by a low temperature plasma oxidation process may further improve the data retention characteristics of the memory device through a reduction of thermal budget.

Some preferred embodiments of the invention will now be described by way of example only and with reference to the accompanying drawings, in which.

In accordance with embodiments of the invention, a strained substrate may reduce the probability that an electron tunnels through a barrier in the following two ways.

First, the height of the tunnel oxide barrier may be increased by the use of tensile stress strained substrates. For example, the strain would reduce tunnel leakage currents by increasing the barrier height between a $SiO_2$ layer and a Si layer via strain-induced changes in the Si and $SiO_2$ electron affinity. For nitride-based memories, the primary electron loss mechanism at elevated temperatures is the thermal de-trapping of the stored electrons, whereby the thermal energy is large enough to overcome the height of the barrier. The thermal electron de-trapping is proportional to exp(−Ea/kT), where Ea is the electron trap activation energy. Tensile stress strain may alter the value of Ea in oxy-nitride, thereby creating a deeper trap and thus improving the Data Retention reliability of the nitride-based memory.

Figure 1:
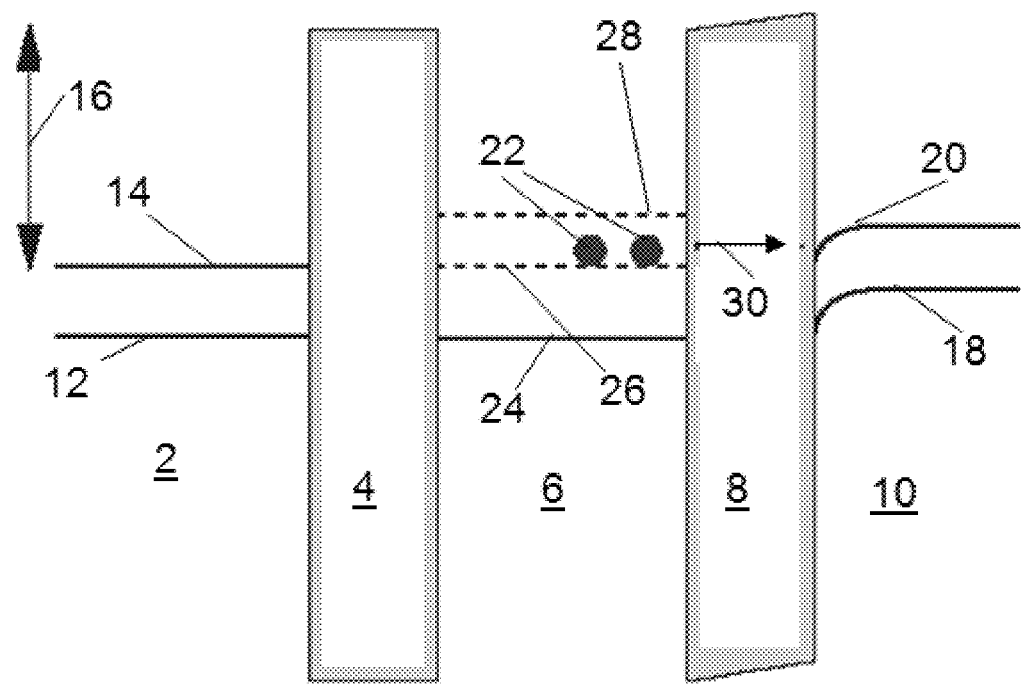
FIG. 1 is an illustration of the energy levels of a semiconductor device according to an embodiment of the present invention.

Second, the value of the total electron conductivity mass m* may be increased by the strain, thereby decreasing the tunneling probability according to equation 1. FIG. 1 shows the energy level structure of a memory device. From left to right, FIG. 1 shows an N-type control gate (2), an $SiO_2$ layer (4), an N-type floating gate (6), a second $SiO_2$ layer (8) and a P-type silicon substrate (10). The N-type control gate (2) has two electronic energy eigenstates (12 and 14). The height of the energy barrier provided by the $SiO_2$ layer (4) is around 9 eV. The difference in energy (indicated by arrow 16) between the $SiO_2$ layer (4) and the highest energy level of the N-type control gate (2) is around 3.2 eV. The P-type silicon substrate (10) has two energy levels (18 and 20). The N-type floating gate (6) is the place where electrons (22) are stored, thereby forming a memory. The N-type floating gate (6) has a lowest energy level (24) and two higher energy levels (26 and 28), which higher energy levels are created when strain is applied to the gate (6).

The n-type floating gate (6) shown in FIG. 1 is bounded by $SiO_2$ barriers (4, 8) and electrons (22) may be trapped in the floating gate (6). The tensile stress causes a splitting of the conduction band and two energy levels (26, 28) within the floating gate (6) are created, which are referred to herein as EΔ2 and EΔ4, respectively. The lower level EΔ2 will be more likely to be populated by the trapped electrons than the higher energy level EΔ4. The electron conductivity mass of energy level EΔ2 is 0.98 times the free electron mass, while the electron conductivity mass of energy level EΔ4 is 0.19 times the free electron mass. A larger electron conductivity mass corresponds to a smaller value of the tunneling probability in accordance with Eq. 1. The tunneling current (30) in these states is significantly reduced due to the change in conductivity mass when compared to the conductivity mass in an unstrained lattice.

For unstressed bulk Si, the conduction band comprises six degenerate valleys. The degeneracy reflects the cubic symmetry of the Si lattice. The effective mass for any direction is inversely proportional to the curvature of the energy dispersion relationship in that direction. Consequently, the effective mass of each ellipsoid is anisotropic, with the transverse mass (perpendicular to the axis) given by $m_t=0.19m_0$ being significantly smaller than the longitudinal mass (parallel to the axis) given by $m_l=0.98m_0$, where $m_0$ is the free electron mass. The total electron conductivity mass m* is obtained by adding the contributions of the six degenerate valleys and is given by equation 2.

$$m^* = \left[\frac{1}{6}\left(\frac{2}{m_l}\right)+\left(\frac{4}{m_t}\right)\right]^{-1} \quad \text{(Eq. 2)}$$

Where $m_t=0.19m_0$ & $m_l=0.98m_0$. Equation 2 expressed in terms of the free electron mass is $m^*=0.047\ m_0$, which is much smaller than the electron conductivity mass in the split lower energy level 26 and corresponds to a much larger tunneling probability.

A different way of understanding the stress induced change of the electron conductivity mass is by considering the change in shape of the atomic lattice of the semiconductor material due to stress. The electron conductivity mass is dependent on the direction in which an electron travels through a lattice. While bulk stress-free silicon has a lattice structure with cubic symmetry, a silicon crystal under stress does not have the same symmetry and an electron travelling through the stressed lattice will have a different conductivity mass.

The splitting resulting in level 26 also increases the $SiO_2/Si$ barrier height, which will also decrease the tunneling current.

A way to implement the use of tensile strain in a memory is by selecting a SiGe-free strained silicon-on-insulator (SSOI) layer. The selection of SiGe-free SSOI instead of a strained-Si/SiGe-on-insulator substrate prevents out-diffusion of germanium. The out-diffusion of germanium decreases the value of $E_g$ in equation 1, thereby increasing the tunneling probability and decreasing the data retention reliability of the NVM. Hence it is preferable to use SSOI otherwise known as SSDOI (strained silicon directly on insulator).

A benefit of using SiGe-free strained SOI, apart from the ability to avoid the problem of Germanium out-diffusion, is that it can also avoid the problem of coarse nano-topography, both of which are associated with a high thermal budget process in direct oxidation of SiGe during the fabrication process. The use of a Silicon Germanium-on-insulator (SGOI) substrate will lead to Ge Out-diffusion during the high thermal process used for device fabrication. In order to eliminate such problem, Strained Silicon-on-Insulator (SSOI) is used instead of SGOI.

The use of fully depleted SOI technology may be beneficial for the formation of 20-50 nm thick strained-Si substrates using SiGe-free SSOI. Fully-depleted type SOI devices have the advantage that short channel effects and floating body effects due to charge pile-up are suppressed. The use of fully-depleted strained silicon-on-insulator (FD-SSOI) to form a 20 to 50 nm thin film of Si enables the implementation of the strained-Si concept for SONOS and CMOS devices. FD-SSOI may also increase the electron and hole mobility in both n- and p-strained-SOI MOSFET for channel, gate and source-drain regions, depending on the tensile/compressive stress axis (biaxial or uniaxial).

As mentioned above, a benefit of a fully-depleted type SOI device is that the short channel effect and floating body effect due to charge pile-up are suppressed. The floating-body effect is an electrical anomaly usually seen in Partially-Depleted devices. Such floating-body effect problem could be solved either by providing a body contact for the device or, as proposed herein, by using the fully depleted device concept to suppress the effect.

The fully depleted SOI device technology may be combined with Deep Trench Isolation (DTI). DTI has an advantage of better NVM reliability and better packing density. The device also offers better NVM integration possibilities by utilising SOI technology.

In particular, the device may be a nanoscale n-channel nitride based semiconductor-oxide-nitride-oxide-semiconductor (SONOS) non-volatile memory with DTI on a fully depleted strained silicon-on-insulator (FD-SSOI) substrate. The device may use SOI based complementary metal oxide semiconductor (CMOS) technology. The use of a strain engineering approach based on state of art semiconductor technology achieves better NVM reliability in terms of data retention. Better reliability is achieved by process induced tensile stress, which may lead to stress-altered changes in the $SiO_2/Si$ barrier height and changes in the trap activation energy in nitride trap based memories. The FD-SSOI use for SONOS and CMOS devices increases the electron and hole mobility in both an n- and a p-strained-SOI MOSFET.

A DTI module built on a SOI substrate enables a very good isolation from the bulk Si with lower parasitic capacitance together with very good isolation of the n- and p-well structures, which reduces power consumption and crosstalk between the n- and p-well structures. The latch-up free benefit of a DTI design provides the possibility of better circuit packing density resulting in improved scalability. The implementation of the DTI concept between memory array blocks enables reduction of the entire macro block standby leakage (off-state leakage). Higher device density is achievable by simplification of the lateral and vertical isolation structures and therefore circuit packing density could be increased, specifically in a periphery circuit for a NVM macro block.

The combination of the features and techniques discussed above enables the fabrication of a low power consumption portable microelectronics memory device. A "SONOS NVM macro" may be constructed with the architecture of SONOS Gate channels with tensile stress on a SiGe-free fully depleted SOI substrate, isolated by DTI technology. This SONOS NVM macro is suitable for applications in high-energy radiation environments, because of better radiation hardness properties which reduce the memory soft error rate. Advantages are lower parasitic capacitance, latch-up free architecture and higher circuit packing density. Furthermore, a memory array's soft error rate or data corruption caused by cosmic rays and natural radioactive background signals is suppressed by this arrangement.

Figure 2:
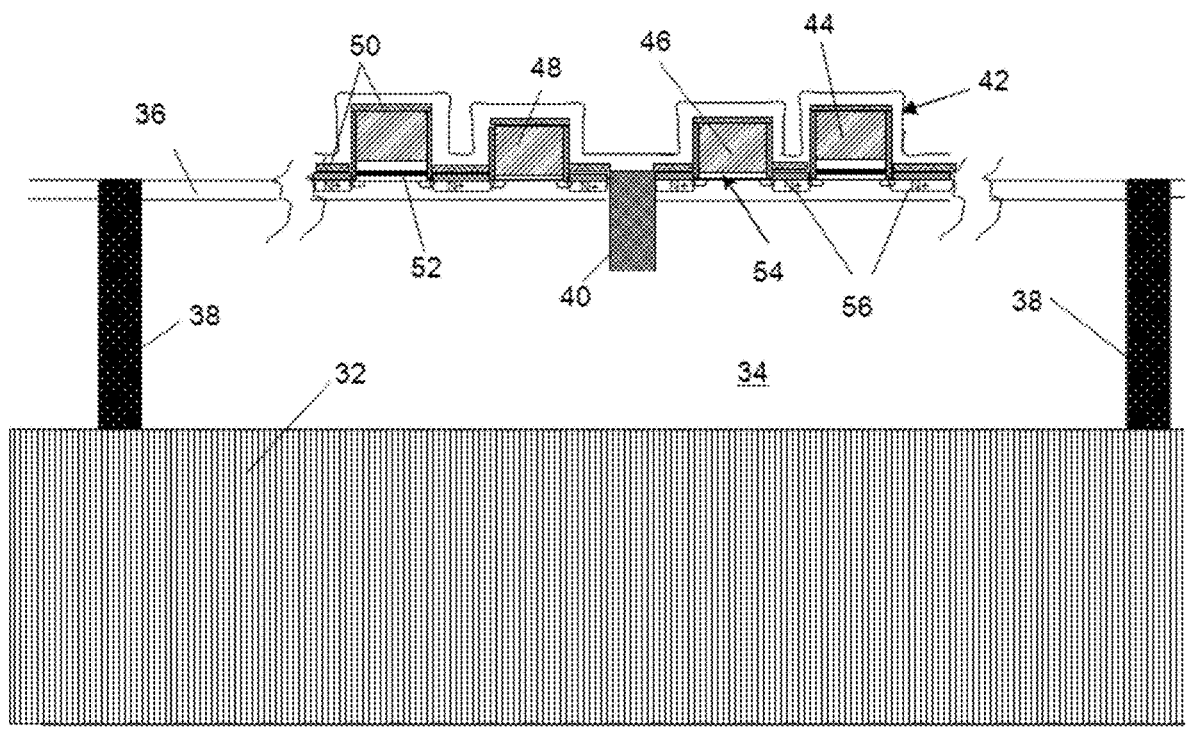
FIG. 2 is a vertical cross-section of a semiconductor device with a strained-Si layer and a CESL according to an embodiment of the present invention.

An embodiment of the present invention is illustrated in FIG. 2 and described as follows. First, the structure is described and then the manufacturing process is described.

An example of a semiconductor device obtained by the process briefly outlined above is shown in FIG. 2. A handle wafer (32) is provided with a substantially flat top surface. On the top surface of the handle wafer (32), a layer of $SiO_2$ (34) is provided with a thickness of approximately 1 micrometer. On top of the $SiO_2$ layer (34) a strained Si layer (36) is provided with a thickness of about 20 to 50 nanometres. One or more DTI layers (38) are provided, extending from the top of the strained Si layer (36) to the handle wafer (32), thereby isolating all semiconductor layers formed on top of the handle wafer (32) on one side of a DTI (38) from those on the other side of the DTI (38). A tensile STI (40) is provided, which extends from a top layer into the $SiO_2$ (34) layer, but not up to the handle wafer (32).

On top of the strained Si layer (36) and partially embedded in the Si layer (36) gates are formed. Examples are shown as a SONOS gate (44) and an access gate (46). The material of the gates themselves is poly-Si (48) and the gates as well as the surfaces between the gates are covered by Ni-silicide (50). A contact etch stop layer (CESL) or dual contact etch stop layer (DCESL) (42) is provided over the Ni-silicide layer (50). Between the Poly-Si (48) of the gates and the strained Si layer (36) gate oxide (GOX) layers (54), which are grown with low temperature plasma oxidation, and oxy-nitride layers (52) are provided. The gates are connected by an n+ doped semiconductor material (56).

The device shown in FIG. 2 illustrates how to create a strain condition over a fully depleted n-channel SONOS gate and an access gate or select gate using SiGe-free SSOI with DTI for an NVM array in combination with a CESL or DCESL. Conventional semiconductor fabrication methods are used to obtain a high packing density NVM cell using strain engineering, making the device fully compatible with nanoscale CMOS processes.

A method of manufacturing the device shown in FIG. 2 is now described. A pad oxide is formed on a ready made SiGe-Free SSOI wafer substrate, and a SiN layer is deposited on the substrate. An active area is then defined by a masking step. An active area isolation is formed by anisotropic etching of the SiN layer, pad oxide and a certain depth of the wafer substrate, thereby forming shallow trench isolation (STI) structures (40); followed by another lithography mask to define deeper DTI regions (38). The DTI regions extend from the surface of the device to the buried oxide interface (32) of the handle wafer. The STI trenches and DTI trenches are processed through liner oxidation prior to being filled with tensile silicon oxide HDP insulating material, followed by thicker DTI LPTEOS (which is low pressure chemical vapour deposition using tetraethyl orthosilicate as raw material) insulating material. Chemical and mechanical polishing is used to polish away unwanted silicon oxides above the SiN layer covering the active area. The active area, STI and DTI isolation are now formed.

A sacrificial thermal oxide layer is then grown followed by various SONOS cell formation masks, including a SONOS well implantation mask, nitride deposition, a SONOS Channel Implantation mask for SONOS threshold voltage optimization, cleaning steps, nitride and sacrificial thermal oxide removal steps and a prior proprietary ONO oxidation process. Subsequently, the next steps comprise masking for ONO removal of the non-SONOS area. The ONO oxidation process consists of a silicon re-oxidation step by rapid thermal oxidation or alternatively by a low-temperature plasma oxidation process. In the re-oxidation approach, part of the oxy-nitride inside the NO stack becomes the top oxide of the eventual ONO stack. By low-temperature, in the context of plasma oxidation it is meant a plasma oxidation process carried out at 400 degrees Celsius or less, more preferably 300 degrees Celsius or less. The temperature of the plasma oxidation process is usually defined as the temperature to which the wafer/substrate is heated during plasma oxidation. The oxidation of silicon in an oxygen plasma allows for the controlled growth of thin, high-quality films of silicon dioxide at temperatures down to room temperature in a clean vacuum environment within a cold-walled chamber. The physical properties of oxide layers formed by low-temperature plasma oxidation are found to be very similar to thermally grown oxide layers. The inventors have appreciated that use of a low-temperature plasma oxidation process enables a high-quality oxide layer to be formed at a lower thermal budget compared to e.g. in-situ steam generation (ISSG) or furnace oxidation processes. The lower thermal budget may result in increased data retention in the non-volatile memory cell since by using a low-temperature plasma oxidation process the device is subject to less heating during fabrication of the tunnel oxide layer. Such heating is known to potentially affect the distribution of dopants within the silicon substrate. Further, low temperature plasma oxidation prevents the strain within the strained silicon on insulator (SSOI) layer being relaxed, i.e. reduced. This also results in improvements in data retention, for example, in devices using an SSOI layer as described herein.

The I/O transistors and access gate and/or select gate transistor wells are formed with various implantation masking and cleaning steps as in conventional CMOS logic processes.

The sacrificial oxide layer and nitride layer (on the SONOS area only) are then removed by wet cleaning using buffer HF (hydrogen fluoride) dipping and hot acid phosphoric stripping respectively and then a first thermal gate oxide is grown. For a dual oxide process, with a first oxide region having a first oxide thickness, and a second oxide region having a second oxide thickness, a dual gate mask is used to cover the envisaged first oxide region. This first gate oxide is removed from the second oxide region by wet cleaning, and the mask is removed. A second thermal gate oxide is now grown to define the final gate oxide thickness in the first and second oxide regions. The gate oxides are grown by furnace oxidation or low-temperature plasma oxidation. In particular, the tunnel oxide layer of the ONO stack may be grown at least partially by low-temperature plasma oxidation in combination with a furnace oxidation process step. Low temperature plasma oxidation may help to prevent the strain layer of SSOI being relaxed due to its lower thermal budget influence. Further, formation of ONO stack top-oxide with low temperature plasma oxidation may result in better overall reliability of the SONOS memory cell and provides further integration flexibly due to the lower thermal budget influence of the low temperature plasma oxidation process compared to e.g. rapid thermal oxidation or furnace oxidation.

After gate poly-silicon has been deposited, all the transistors are then defined by a poly mask over the active region, and unwanted polysilicon in the area not covered by the mask is etched by anisotropic etching. This is followed by various masking, LDD implantations and cleaning steps. An L-shape poly-Si sidewall is now formed, followed by source/drain implantations and Ni-salication.

Subsequently, a contact etch stop layer (CESL) is deposited. A contact etch stop layer/liner technique is realized after wafer salication by depositing a stressed liner on top of the gate stack. In a preferred embodiment the CESL may have a low refractive index. For example, the refractive index may be less than 1.90, preferably in the range from 1.65 to 1.8. In one embodiment, the refractive index of the CESL may be 1.72±0.05. The CESL layer may have tensile or compressive strain. The refractive index figure may be the refractive index at optical wavelengths, e.g. in the wavelength range from approximately 400 nm to 800 nm. Prior-known stressed nitride films may have higher refractive indices, e.g. in the region of 2.0.

The CESL may be a dual CESL (DCESL), also known as a dual stress liner (DSL). In order to fabricate the DCESL, first an oxy-nitride layer is deposited. This is then etched in intended areas by means of a mask. Subsequently the low refractive index (LRI) oxy-nitride layer is deposited following by further etching with a mask to protect the LRI oxy-nitride film in intended areas. A dual CESL may have regions which apply a tensile strain to the underlying layers and other regions which apply a compressive strain to the underlying layers.

The final step is to complete back-end of line (BEOL) metallization using nanoscale semiconductor fabrication methods. The required SONOS cell transistors, I/O transistors and access gate (46) or select gate transistors are then fabricated.

The thickness of the CESL is typically in the range from 300 Å to 500 Å. In one example the thickness of the CESL is approximately 400 Å. The process recipe of the LRI $SiO_xN_y$ CESL material is disclosed in the table below:

|  | $SiH_4$, sccm | $N_2O$, sccm | $N_2O:SiH_4$ Ratio | Refractive Index (RI) |
|---|---|---|---|---|
| LRI CESL (Dominant Parameters) | 52 | 180 | 3.462 | 1.72 ± 0.05 |

Figure 3A:
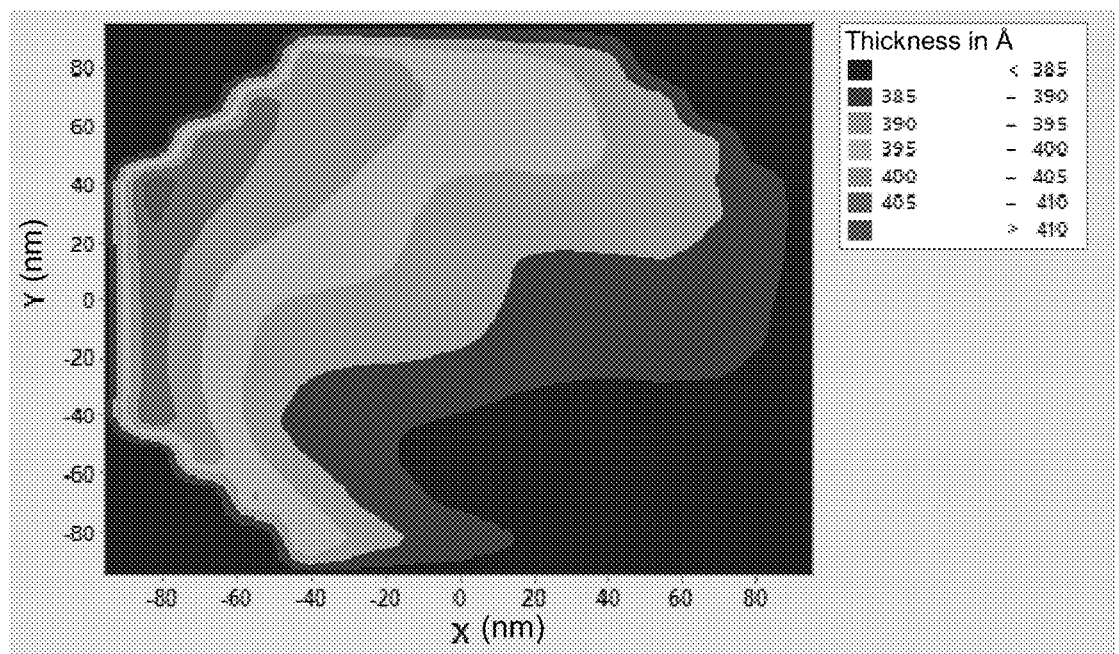
FIGS. 3a and 3b are contour plots of the thickness and refractive index of a low refractive index CESL according to the invention.
Figure 3B:
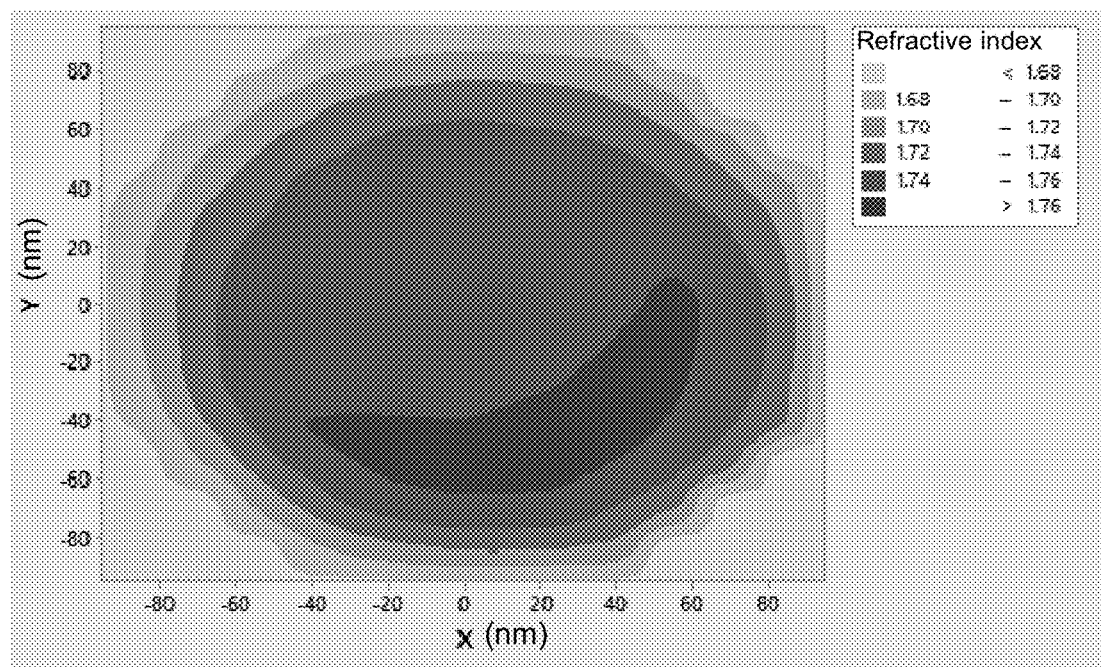

FIG. 3a is a contour plot of the thickness variation of a LRI CESL fabricated according to the recipe above. FIG. 3b is a contour plot of the refractive index of a LRI CESL fabricated according to the recipe above.

Utilization of the LRI Silicon Oxy-nitride CESL of the present invention further enhances the performance benefits obtained from the use of fully depleted SOI technology coupled with deep trench isolation (DTI). For example, it offers advantages such as better NVM reliability and packing density. Accordingly, the invention offers an improved NVM integration solution in strain engineering of SOI technology and memory device fabrication for both floating gate memories and SONOS memories.

Secondly, the introduction of the LRI SiOxNy CESL enables the standardization of the CESL for multiple applications without any incompatibility issue. For example, the same LRI CESL has been found to be suitable for a wide range of applications including: logic, analogue, high voltage super junction, photo diodes/sensors, floating gate based NVM and SONOS based NVM. This is an advantage in terms of integration and streamlining of production. Further, it mitigates any potential incompatibility issues whereby a CESL with a higher refractive index may still be satisfactory for use with an NVM but may not be suitable for use with a photo sensor, for example. Prior-known stressed nitride films may not be suitable for use in photo sensor applications, in contrast to a CESL having a low refractive index according to the present invention.

Memory devices according to the present invention may be less susceptible to soft errors or data corruption caused by cosmic rays and natural radioactive background signals. This is as a result of the improved endurance and data retention characteristics as a result of the strain engineering provided both by the SSOI layer and the CESL.

In terms of floating gate memory device data retention, the better reliability could be quantified as: 400 Å LRI $SiO_xN_y$>450 Å $Si_3N_4$>400 Å $SiO_xN_y$. The 400 Å LRI $SiO_xN_y$ CESL recipe margin (±10 sccm variations) still demonstrated better floating gate NVM data retention properties than a 450 Å $Si_3N_4$ high stress nitride film.

Figure 4:
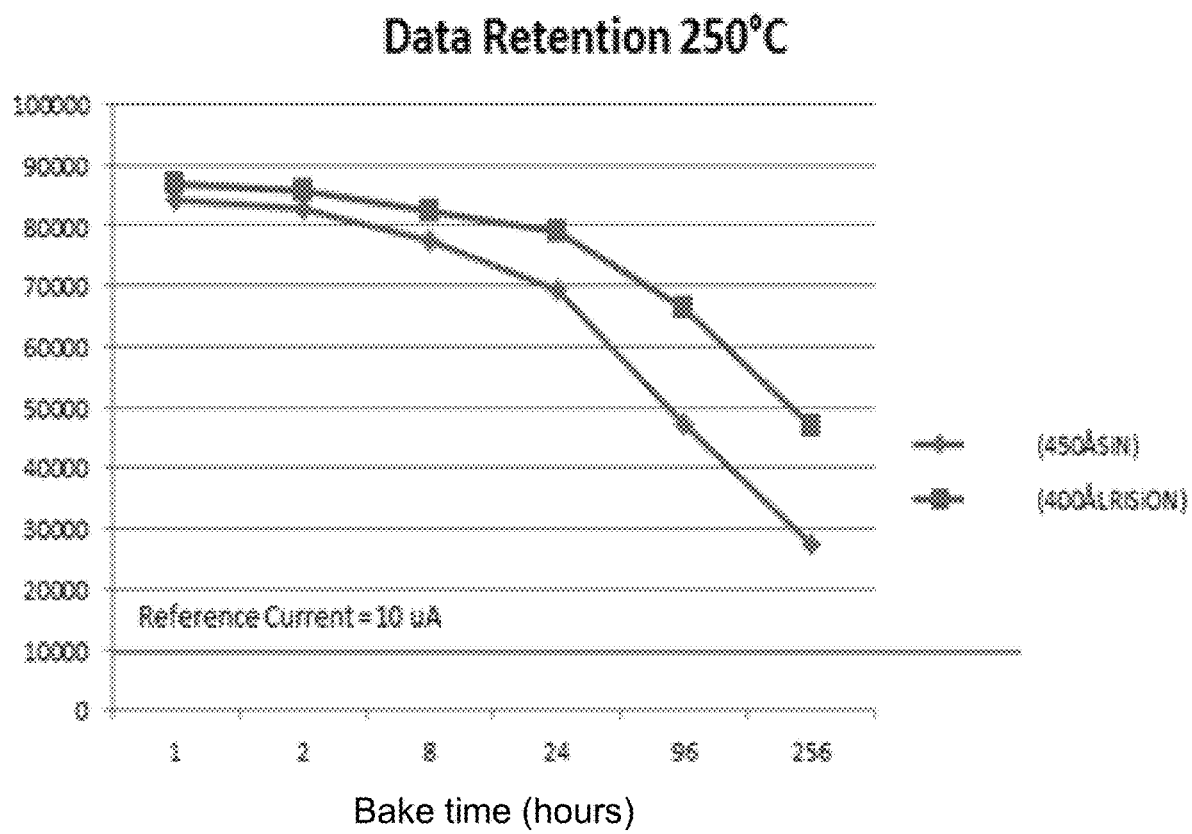
FIG. 4 is a plot of a data retention characterization for one-time programmable NVM memories having either a 400 Å thick low refractive index $SiO_xN_y$ CESL or a 450 Å thick $Si_3N_4$ CESL.

FIG. 4 is a plot of data retention measurements performed for one-time programmable NVM memories having either a 400 Å LRI $SiO_xN_y$ CESL or a 450 Å $Si_3N_4$ CESL. The data retention with the LRI CESL is clearly improved.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A semiconductor flash memory device comprising a strained semiconductor layer, a charge trapping layer, and a contact etch stop layer, CESL,
   wherein the CESL comprises a silicon oxynitride contact etch stop layer having a refractive index in the range from 1.65 to 1.80,
   wherein the CESL forms part of a dual stress liner having both compressive and tensile strain regions, and
   wherein the strained semiconductor layer forms part of a strained silicon directly on insulator, SSOI, layer.

2. The semiconductor flash memory device according to claim 1, wherein the SSOI layer is substantially SiGe-free.

3. The semiconductor flash memory device according to claim 1, wherein the thickness of the strained semiconductor layer is in the range from 20 nm to 50 nm.

4. The semiconductor flash memory device according to claim 1, further comprising a deep trench isolation, DTI, region provided within the SSOI layer.

5. The semiconductor flash memory device according to claim 1, wherein the memory device is a SONOS memory device and the charge trapping layer is a silicon nitride or silicon oxynitride layer forming part of an ONO stack.

6. The semiconductor flash memory device according to claim 1, wherein the memory device is a floating gate flash memory device and the charge trapping layer is the floating gate.

7. The semiconductor flash memory device according to claim 6, wherein the floating gate is formed of polysilicon.

8. The semiconductor flash memory device according to claim 1, wherein the CESL is strained.

9. The semiconductor flash memory device according to claim 1, wherein the thickness of the CESL is in the range from 300 Å to 500 Å.

10. The semiconductor flash memory device according to claim 1, wherein the thickness of the CESL is substantially 400 Å.

11. The semiconductor flash memory device according to claim 1, wherein the refractive index of the CESL is substantially 1.72.

12. A method for use in fabricating a semiconductor flash memory device according to claim 1, the method comprising:
   providing a substrate having thereon the strained silicon on insulator, SSOI, layer;
   forming a tunnel oxide layer on the SSOI layer;
   forming a charge trapping layer on the tunnel oxide layer;
   forming a polysilicon layer above the charge trapping layer; and
   depositing a suicide layer and the contact etch stop layer, CESL, on the polysilicon layer,
   wherein the CESL comprises a silicon oxynitride contact etch stop layer wherein parameters of the CESL deposition are chosen to result in the silicon oxynitride contact etch stop layer having a refractive index in the range from 1.65 to 1.80, wherein the CESL forms part of a dual stress liner having both compressive and tensile strain regions, and wherein the strained semiconductor layer forms part of a strained silicon directly on insulator, SSOI, layer.

13. The method according to claim 12, wherein the semiconductor flash memory device is a SONOS memory device and the charge trapping layer is a silicon oxynitride or silicon nitride layer forming part of an ONO stack, wherein the method further comprises:

forming the top oxide layer of the ONO stack by re-oxidizing part of the silicon oxynitride or silicon nitride layer of the stack by a low-temperature plasma oxidation process.

14. The method according to claim 12, wherein the tunnel oxide layer is formed by a low-temperature plasma oxidation process.

15. The method according to claim 13, wherein the temperature of the low-temperature plasma oxidation process is less than or equal to 400 degrees Celsius.

16. The method according to claim 12, further comprising forming one or more deep trench isolation, DTI, regions within the SSOI layer.

17. The method according to claim 12, wherein parameters of the CESL deposition are chosen to result in a CESL having a refractive index of substantially 1.72.

18. The semiconductor flash memory device according to claim 1, wherein the strained semiconductor layer and the CESL are both formed so as to reduce the probability of an electron tunnelling out of the charge trapping layer.

* * * * *